United States Patent
Geusic et al.

(10) Patent No.: US 6,496,370 B2
(45) Date of Patent: *Dec. 17, 2002

(54) STRUCTURE AND METHOD FOR AN ELECTRONIC ASSEMBLY

(75) Inventors: Joseph E. Geusic, Berkeley Heights, NJ (US); Leonard Forbes, Corvallis, OR (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/836,564

(22) Filed: Apr. 17, 2001

(65) Prior Publication Data

US 2001/0026439 A1 Oct. 4, 2001

Related U.S. Application Data

(63) Continuation of application No. 09/143,729, filed on Aug. 31, 1998, now Pat. No. 6,219,237.

(51) Int. Cl.[7] .................................................. H05K 7/20
(52) U.S. Cl. ....................... 361/699; 165/80.4; 257/714; 361/701; 361/720
(58) Field of Search .............................. 165/80.2, 80.4, 165/80.5, 185; 174/15.1, 14 R, 257, 256; 257/714, 276; 361/688–689, 699, 701–702, 704–705, 707–708, 711, 715, 719–720, 785; 439/66, 69, 485, 487

(56) References Cited

U.S. PATENT DOCUMENTS

| | | | |
|---|---|---|---|
| 3,923,567 A | 12/1975 | Lawrence | 156/7 |
| 3,959,047 A | 5/1976 | Alberts et al. | 156/8 |
| 3,982,268 A | 9/1976 | Anthony et al. | 357/55 |
| 4,081,701 A | 3/1978 | White, Jr. et al. | 307/355 |

(List continued on next page.)

FOREIGN PATENT DOCUMENTS

| | | |
|---|---|---|
| JP | 4-133472 | 5/1992 |
| WO | 94/05039 | 3/1994 |

OTHER PUBLICATIONS

Beddingfield, C., et al., "Flip Chip Assembly of Motorola Fast Static RAM Known Good Die", *1997 Proceedings, 47th Electronic Components and Technology Conference*, San Jose, CA, 643–648, (May 18–21, 1997).

Blalock, T.N., et al., "A High–Speed Clamped Bit–Line Current–Mode Sense Amplifier", *IEEE Journal of Solid–State Circuits*, 26 (4), 542–548, (Apr. 1991).

Cao, L., et al., "A Novel "Double–Decker" Flip–Chip/BGA Package for Low Power Giga–Hertz Clock Distribution", *1997 Proceedings, 47th Electronic Components and Technology Conference*, San Jose, CA, 1152–1157, (May 18–21, 1997).

(List continued on next page.)

*Primary Examiner*—Gregory Thompson
(74) *Attorney, Agent, or Firm*—Schwegman, Lundberg, Woessner & Kluth, P.A.

(57) ABSTRACT

An electronic assembly is provided. The electronic assembly includes a semiconductor interposer having first and second surfaces. The semiconductor interposer also has cooling channels passing through the interposer between the first and second surfaces. The electronic assembly has at least one semiconductor chip disposed outwardly from the first surface of the semiconductor interposer and at least one semiconductor chip disposed outwardly from the second surface of the semiconductor interposer. The electronic assembly also has a number of electrical connections through the semiconductor interposer wherein the number of electrical connections couple the semiconductor chips disposed outwardly from the first and second surfaces of the semiconductor interposer.

55 Claims, 3 Drawing Sheets

U.S. PATENT DOCUMENTS

| | | | |
|---|---|---|---|
| 4,394,712 A | 7/1983 | Anthony | 361/411 |
| 4,595,428 A | 6/1986 | Anthony et al. | 148/187 |
| 4,631,636 A | 12/1986 | Andrews | 361/385 |
| 4,653,025 A | 3/1987 | Minato et al. | 365/154 |
| 4,739,446 A | 4/1988 | Landis | 361/385 |
| 4,870,470 A | 9/1989 | Bass, Jr. et al. | 357/23.5 |
| 4,977,439 A | 12/1990 | Esquivel et al. | 357/49 |
| 5,061,987 A | 10/1991 | Hsia | 357/71 |
| 5,079,618 A | 1/1992 | Farnworth | 357/81 |
| 5,153,814 A | 10/1992 | Wessely | 361/382 |
| 5,229,327 A | 7/1993 | Farnworth | 437/209 |
| 5,258,648 A | 11/1993 | Lin | 257/778 |
| 5,275,001 A | 1/1994 | Yokotani et al. | 62/3.7 |
| 5,313,361 A | 5/1994 | Martin | 361/699 |
| 5,317,197 A | 5/1994 | Roberts | 257/401 |
| 5,343,366 A | 8/1994 | Cipolla et al. | 361/785 |
| 5,352,998 A | 10/1994 | Tamino | 333/247 |
| 5,362,976 A | 11/1994 | Suzuki | 257/81 |
| 5,392,407 A | 2/1995 | Heil et al. | 395/325 |
| 5,409,547 A | 4/1995 | Watanabe et al. | 136/204 |
| 5,415,699 A | 5/1995 | Harman | 138/238 |
| 5,432,823 A | 7/1995 | Gasbarro et al. | 375/356 |
| 5,468,681 A | 11/1995 | Pasch | 437/183 |
| 5,532,506 A | 7/1996 | Tserng | 257/276 |
| 5,567,654 A | 10/1996 | Beilstein, Jr. et al. | 437/209 |
| 5,587,119 A | 12/1996 | White | 264/104 |
| 5,598,031 A | 1/1997 | Groover et al. | 257/668 |
| 5,610,366 A | 3/1997 | Fleurial et al. | 136/202 |
| 5,618,752 A | 4/1997 | Gaul | 438/626 |
| 5,622,875 A | 4/1997 | Lawrence | 438/691 |
| 5,637,828 A | 6/1997 | Russell et al. | 174/52.2 |
| 5,646,067 A | 7/1997 | Gaul | 437/180 |
| 5,656,548 A | 8/1997 | Zavracky et al. | 438/23 |
| 5,657,481 A | 8/1997 | Farmwald et al. | 395/551 |
| 5,682,062 A | 10/1997 | Gaul | 257/686 |
| 5,692,558 A | 12/1997 | Hamilton et al. | 165/80.4 |
| 5,699,291 A | 12/1997 | Tsunemine | 365/149 |
| 5,753,529 A | 5/1998 | Chang et al. | 437/67 |
| 5,767,001 A | 6/1998 | Bertagnolli et al. | 438/455 |
| 5,786,628 A | 7/1998 | Beilstein, Jr. et al. | 257/684 |
| 5,807,783 A | 9/1998 | Gaul et al. | 438/406 |
| 5,821,624 A | 10/1998 | Pasch | 257/776 |
| 5,834,799 A | 11/1998 | Rostoker et al. | 257/98 |
| 5,855,735 A | 1/1999 | Takada et al. | 156/636.1 |
| 5,861,666 A | 1/1999 | Bellaar | 257/686 |
| 5,901,050 A | 5/1999 | Imai | 361/820 |
| 5,902,118 A | 5/1999 | Hubner | 438/106 |
| 5,903,045 A | 5/1999 | Bertin et al. | 257/621 |
| 5,915,167 A | 6/1999 | Leedy | 438/109 |
| 6,016,256 A | 1/2000 | Crane, Jr. et al. | 361/813 |
| 6,219,237 B1 * | 4/2001 | Geusic et al. | 361/699 |

OTHER PUBLICATIONS

Crisp, R., "Development of Single–Chip Multi–GB/s DRAMs", *Digest of International Solid–State Circuits Conference*, 226–227, (1997).

Crisp, R., "Rambus Technology, the Enabler", *Conference Record of WESCON*, Anaheim, CA, 160–165, (Nov. 17–19, 1992).

Demmin, J., "nCHIP's Silicon Circuit Board Technology", *National Electronic Packaging and Production Conference, NEPCON West 94, 3*, Proceedings of the Technical Program, 2038–9, (1993).

Donnelly, K.S., et al., "A 660MB/s Interface Megacell Portable Circuit in—.3 mum–0.7 mum CMOS ASIC", *IEEE Journal of Solid–State Circuits, 32(12)*, 1995–2003, (Dec. 1996).

Feinberg, I., et al., "Interposer for Chip–on–Chip Module Attachment", *IBM Technical Disclosure Bulletin, 26(9)*, 4590–91, (Feb. 1984).

Foster, R., et al., "High Rate Low–Temperature Selective Tungsten", *In: Tungsten and Other Refractory Metals for VLSI Applications III*, V.A. Wells, ed., Materials Res. Soc., Pittsburgh, PA, 69–72, (1988).

Goodman, T., et al., "The Flip Chip Market", *Advanced Packaging*, 24–25, (Sep./Oct. 1997).

Gray, P.R. et al., "Analysis and Design of Analog and Integrated Circuits", *John Wiley and Sons, 2nd ed.*, 617–622, (1984).

Heremans, P., et al., "Optoelectronic Integrated Receiver for Inter–MCM and Inter–Chip Optical Interconnects", *Technical Digest, International Electron Devices Meeting*, 657–660, (Dec. 1996).

Horie, H., et al., "Novel High Aspect Ratio Aluminum Plug for Logic/ DRAM LSI's Using Polysilicon–Aluminum Substitute", *Technical Digest: IEEE International Electron Devices Meeting*, San Francisco, CA, 946–948, (1996).

Horowitz, M., et al., "PLL Design for a 500mbs Interface", *Dig. International Solid–State Circuits Conference*, 160–161, (1993).

Huth, N., "Next–Generation Memories", *Electronik, 42(23)*, 36–44, (1993).

Krishnamoorthy, A.V., et al., "Ring Oscillators with Optical and Electrical Readout Based on Hybrid GaAs MQW Modulators Bonded to 0.8 Micron Silicon VLSI Cricuits", *Electronics Lett. 31(22)*, 1917–18, (Oct. 26, 1995).

Lee, T.H., et al., "A 2.5V Delay–Locked Loop for an 18Mb 500MB/s DRAM", *Digest of International Solid–State Circuits Conference*, 300–301, (1994).

Lehmann, V., "The Physics of Macropore Formation in Low Doped n–Type Silicon", *Journal of the Electrochemical Society, 140(10)*, 2836–2843, (Oct. 1993).

Lin, C.M., et al., "Precision Embedded Thin Film Resistors for Multichip Modules (MCM–D)", *Proceedings IEEE Multichip Module Conference*, 44–9, (1997).

Mimura, T., et al., "System Module: a New Chip–on–Chip Module Technology", *Proceedings of 1997 IEEE Custom Integrated Circuit Conference*, 439–442, (1997).

Muller, K., et al., "Trench Storage Node Technology for Gigabit DRAM Generations", *Digest IEEE International Electron Devices Meeting*, San Francisco, CA, 507–510, (Dec. 1996).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals, for VLSI Applications IV*, Materials Research Society, Pittsburgh, PA, 17–25, (1989).

Patel, N.G., et al., "Thermoelectric Cooling Effect in a p–Sb2Te3/n–Bi2Te3 Thin Film Thermocouple", *Solid–State Electronics 35(9)*, 1269–72, (1992).

Ramo, S., et al., *Fields and Waves in Communication Electronics, Third Edition*, John Wiley & Sons, Inc., pp. 428–433, (1994).

Rucker, T.G., et al., "A High Performance SI on SI Multichip Module Technology", *1992 Symposium on VLSI Technology, Digest of Technical Papers, IEEE*, Japanese Society of Applied Physics, 1992 Seattle, WA, 72–73, (Jun. 2–4, 1992).

Sekine, et al., "A New High–Density Plasma Etching System Using a Dipole–Ring Magnet", *Jpn. J. Appl. Phys., Pt. 1, No. 11,* 6274–6278, (Nov. 1995).

Seraphim, D.P., et al., "Principles of Electronic Packaging.", *In: Principles of Electronic Packaging,* McGraw–Hill, New York, NY, 44, 190, 595–597, (1989).

Shafai, C., et al., "A Micro–Integrated Peltier Heat Pump for Localized On–chip Temperature Control.", *Canadian Journal of Physics, 74, Suppl., No. 1,* S139–142, (1996).

Shafai, C., et al., "Optimization of Bi2Te3 Thin Films for Microintegrated Peltier Heat Pumps", *Journal of Vacuum Science and Technology A, Second Series 15, No. 5,* Preliminary Program, 44th National Symposium of the AVS, San Jose, CA, 2798–2801, (Sep./Oct. 1997).

Su, D.K., et al., "Experimental Results and Modeling Techniques for Substrate Noise in Mixed–Signal Integrated Circuits", *IEEE Journal of Solid–State Circuits, 28(4),* 420–430, (Apr. 1993).

Vardaman, E.J., et al., "CSPs: Hot new packages for cool portable products", *Solid State Technology, 40(10),* 84–89, (Oct. 1997).

Vendier, O., et al., "A 155 Mbps Digital Transmitter Using GaAs Thin Film LEDs Bonded to Silicon Driver Circuits", *Digest IEEE/LEOS 1996 Summer Topical Meetings,* Advanced Applications of Lasers in Materials and Processing, 15–16, (1996).

Vusirikala, V., et al., "Flip–chip Optical Fiber Attachment to a Monolithic Optical Receiver Chip", *SPIE Proceedings* (*The Interational Society for Optical Engineering*), *2613,* 52–58, (Oct. 24, 1995).

\* cited by examiner

STRUCTURE AND METHOD FOR AN ELECTRONIC ASSEMBLY

This application is a Continuation of U.S. application Ser. No. 09/143,729, filed Aug. 31, 1998, now U.S. Pat. No. 6,219,237.

FIELD OF THE INVENTION

The present invention relates generally to integrated circuits. More particularly, it pertains to a structure and method for an electronic assembly.

BACKGROUND

Integrated circuits form the basis for many electronic systems. Essentially, an integrated circuit includes a vast number of transistors and other circuit elements that are formed on a single semiconductor wafer or chip and are interconnected to implement a desired function. The complexity of these integrated circuits requires the use of an ever increasing number of linked transistors and other circuit elements.

Many electronic systems are created through the use of a variety of different integrated circuits; each integrated circuit performing one or more specific functions. For example, computer systems include at least one microprocessor and a number of memory chips. Conventionally, each of these integrated circuits is formed on a separate wafer or chips, packaged independently and interconnected on, for example, a printed circuit board.

As integrated circuit technology progresses, there is a growing desire for a "system on a chip" in which the functionality of all of the integrated circuits of the system are packaged together without a conventional printed circuit board. Ideally, a computing system would be fabricated with all the necessary integrated circuits on one wafer, as compared with today's method of fabricating many chips of different functions and packaging them to assemble a complete system. Such a structure would greatly improve integrated circuit performance and provide higher bandwidth.

In practice, it is very difficult with today's technology to implement a truly high-performance "system on a chip" because of vastly different fabrication processes and different manufacturing yields for the logic and memory circuits.

As a compromise, various "system modules" have been introduced that electrically connect and package integrated circuit devices which are fabricated on the same or on different semiconductor wafers. Initially, system modules were created by simply stacking two semiconductor chips, e.g. a logic and memory chip, one on top of the other in an arrangement commonly referred to as chip-on-chip (COC) structure. Chip-on-chip structure most commonly utilizes micro bump bonding technology (MBB) to electrically connect the two chips. Several problems, however, remain inherent with this design structure. One serious complication includes the heating which occurs most seriously in connection with a logic chip such as a microprocessor. In high-performance microprocessors, where the microprocessor runs at a high speed, e.g., on the order of 500 MHz, the microprocessor can dissipate a large quantity of heat such that cooling becomes a crucial issue.

Thus, it is desirable to develop an improved structure and method for cooling integrated circuits in electronic systems. Additionally, the improved structure and method should accommodate a dense integration and packaging for semiconductor chips, e.g. logic and memory chips.

SUMMARY OF THE INVENTION

The above mentioned problems with integrated circuits and other problems are addressed by the present invention and will be understood by reading and studying the following specification. An electronic assembly is formed around a semiconductor interposer with cooling channels that are formed through the semiconductor interposer. In some embodiments, the cooling channels are filled with a liquid or refrigerant.

DETAILED DESCRIPTION

Figure 1:
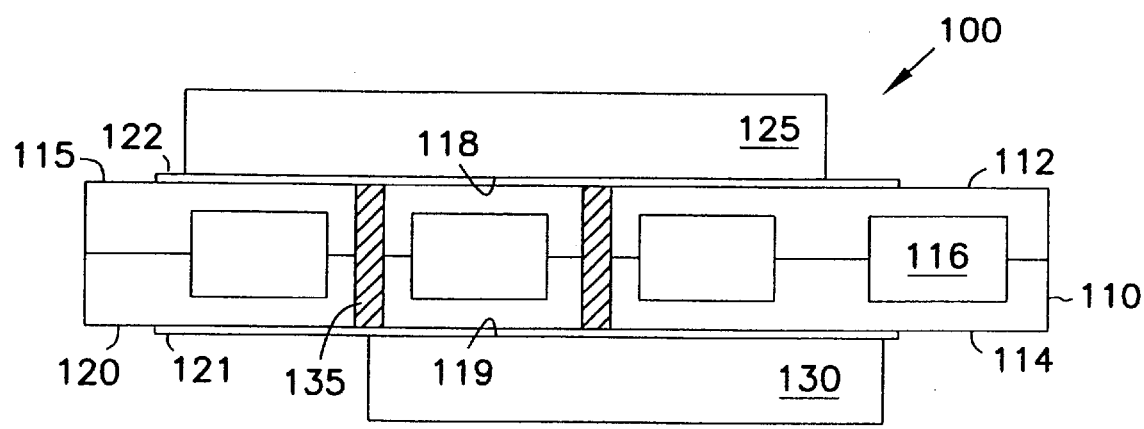
FIG. 1 is a cross-sectional view illustrating an electronic packaging assembly according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

For purposes of this specification, the terms "chip," "wafer" and "substrate" include any structure having an exposed surface of semiconductor material with which to form integrated circuit (IC) structures. These terms are also used to refer to semiconductor structures during processing, and may include other layers that have been fabricated thereupon. The terms include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on," "side" (as in "sidewall"), "higher", "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

FIG. 1 is a cross-sectional view illustrating an "electronic assembly" or "electronic system module" 100 according to the teachings of the present invention. The assembly 100 includes a semiconductor interposer 110. Semiconductor interposer 110 is formed using semiconductor material, e.g., silicon, gallium arsenide, or other appropriate semiconductor material. The semiconductor interposer 110 includes first and second opposite surfaces 115 and 120, respectively. The assembly 100 includes at least one semiconductor chip 125 coupled to a wiring layer 122 on the first surface 115 of the interposer 110. In one exemplary embodiment, semiconductor chip 125 is a microprocessor chip. In another embodiment, semiconductor chip 125 includes any suitable logic chip. The semiconductor chip 125 includes a functional circuit that is formed in a working surface 118 of semiconductor chip 125. This working surface 118 provides connection points for the integrated circuit of semiconductor chip 125 to be connected to the wiring layer 122.

The assembly 100 further includes at least one semiconductor chip 130 that is coupled to a wiring layer 121 on the second side 120 of the interposer 110. In one exemplary embodiment, semiconductor chip 130 includes a memory chip. The memory chip can include a dynamic random access memory (DRAM)-type chip. Likewise, the memory chip can include a static random access memory (SRAM)-type chip or flash electrically erasable program read only memory (flash EEPROM)-type chip or other appropriate memory chip. The semiconductor chip 130 includes a functional circuit that is formed in a working surface 119. This working surface 119 provides connection points for the integrated circuit of semiconductor chip 130 to be connected to the wiring layer 121.

FIG. 1 illustrates that semiconductor chip 125 is coupled to the at least one semiconductor chip 130 by a number of electrical connections 135. Electrical connections 135 include vias formed through the thickness of interposer 110. Electrical connections 135 may be formed using, for example, the techniques shown and described with respect to FIGS. 1–8 of co-pending application Ser. No. 08/917,443, entitled "Integrated Circuitry and Methods of Forming Integrated Circuitry," filed on Aug. 22, 1997 or with respect to FIGS. 1–13 of application Ser. No. 08/917,449, entitled "Methods of Forming Coaxial Integrated Circuitry Interconnect Lines, and Integrated Circuitry," filed on Aug. 22, 1997, which applications are incorporated herein by reference.

Interposer 110 includes a number of cooling channels 116 that allow for circulated liquid or refrigerant coolant to remove heat generated by semiconductor chips 125 and 130. For example, cooling channels 116 may be filled with water, Freon, ethylene glycol (antifreeze-type of solution), or other appropriate liquid for removing heat generated during operation of the integrated circuits.

In one embodiment, interposer 110 is fabricated from first and second semiconductor wafers 112 and 114, respectively. Semiconductor wafers 112 and 114 may comprise, for example, rejected silicon wafers which have been recycled from the front-end of the semiconductor fabrication process. Alternatively, other semiconductor materials can be used to fabricate interposer 110.

Cooling channels 116 are formed by etching trenches in surfaces of semiconductor wafers 112 and 114, respectively. The surfaces of semiconductor wafers 112 and 114 containing the trenches are bonded together so as to form the cooling channels 116 using, for example, the technique described below with respect to FIGS. 2a, 2b, 2c, 2d, and 2e. Advantageously, cooling channels 116 provide for increased capability in dissipating heat from integrated circuits such as microprocessors that operate at high speeds. This allows the high speed microprocessors to be coupled with other integrated circuits, such as memory devices, through semiconductor interposer 110 and to produce a smaller system than is available conventionally in the art.

Figure 2A:
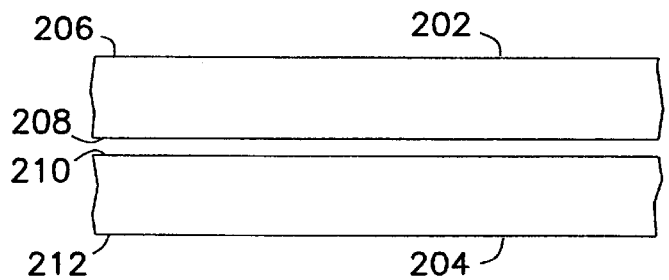
FIGS. 2a, 2b, 2c, 2d, and 2e are cross-sectional views illustrating an electronic assembly according to the teachings of the present invention at various points in the fabrication process.

FIGS. 2a, 2b, 2c, 2d, and 2e are cross sectional views of an electronic assembly at various points during the fabrication process according to the teachings of the present invention. Electronic assembly 200 begins with first and second semiconductor wafers 202 and 204 as shown in FIG. 2a. In one embodiment, first and second semiconductor wafers 202 and 204 comprise N-type silicon wafers that are polished flat and parallel. These wafers may be rejected silicon wafers that have been recycled. Wafer 202 has first and second opposite surfaces 206 and 208, respectively. Similarly, semiconductor wafer 204 includes first and second opposite surfaces 210 and 212, respectively.

Figure 2B:
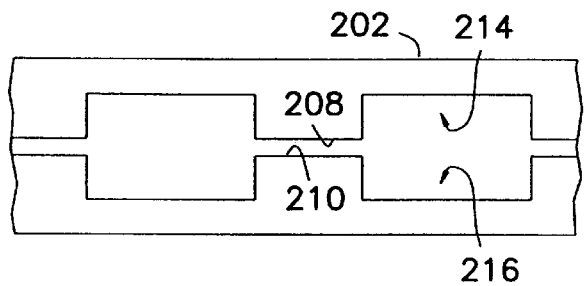

As shown in FIG. 2b, the cooling channels of interposer 200 are formed initially by creating trenches in opposing surfaces of semiconductor wafers 202 and 204. Specifically, trenches 214 are formed in surface 208 of semiconductor wafer 202. Similarly, trenches 216 are formed in surface 210 of semiconductor wafer 204. These trenches are formed, for example, using an anodic etching process which provides a highly anisotropic and controllable method. An acceptable process is described in V. Lehman, "The Physics of Macropote Formation in Low Doped N-type Silicon", J. Electrochem. Soc., Vol. 140, No. 10, October 1993, pages 2836–2843, which is incorporated by reference. Other appropriate etching techniques for creating trenches in semiconductor wafers can also be used.

Figure 2C:
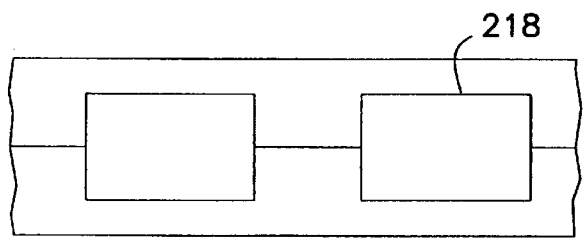

Trenches 214 and 216 are formed in their respective semiconductor wafers, 202 and 204, such that when the wafers are aligned, the trenches 214 and 216 form cooling channels as shown in FIG. 2c. Wafers 202 and 204 are bonded in vacuum using, for example, a process described in U. Gosele et al., "Self-Propagating Room Temperature Silicon Wafer Bonding in Ultrahigh Vacuum", Appl. Phys. Lett., 87 (24), Dec. 11, 1995, pages 3614–3616, which is incorporated by reference. Using this vacuum bonding process, surfaces 208 and 210 are annealed at a temperature of 600° C. to 800° C. in vacuum to drive off hydrogen from the semiconductor, e.g., silicon, surfaces prior to bonding. The bond strength obtained using this process is approximately on the order of bulk semiconductor material. It is noted that other appropriate bonding techniques for coupling semiconductor wafers can also be used. When bonded, trenches 214 and 216 are aligned so as to form cooling channels 218 within interposer 200.

Figure 2D:
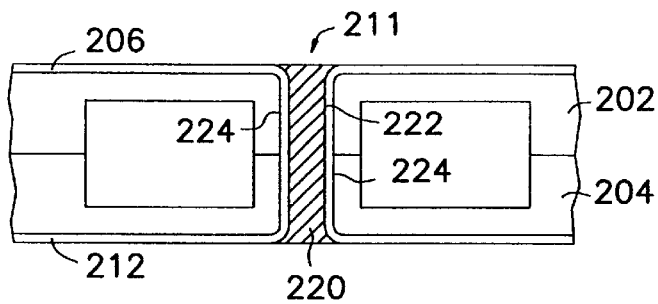

As shown in FIG. 2d, interconnect 220 is formed through wafers 202 and 204 to allow interconnection of semiconductor wafers housing integrated circuits that are disposed adjacent to surfaces 206 and 212. For example, via 211 may be formed through semiconductor wafers 202 and 204 using the technique described in the Lehman reference incorporated above. Further, a low pressure chemical vapor deposition is used to form thin insulating silicon nitride film 222 on walls 224 of the via 211 and on surfaces 206 and 212 of wafers 202 and 204, respectively. Further, a polysilicon substitution technique is used to form interconnect 220 in via 211. Such a process is described in H. Horie et al., "Novel High Aspect Ratio Aluminum Plug for Logic/ DRAM LSI's Using Polysilicon-Aluminum Substitute," Dig. IEEE Int. Electron Device Meeting, San Francisco, pages 946–948, 1996, which is incorporated herein by reference. This technique allows aluminum or other appropriate conductive material to fill a high aspect ratio via 211 running between surfaces 206 and 212. Other appropriate techniques may be used to form interconnects between surfaces 206 and 212.

Figure 2E:
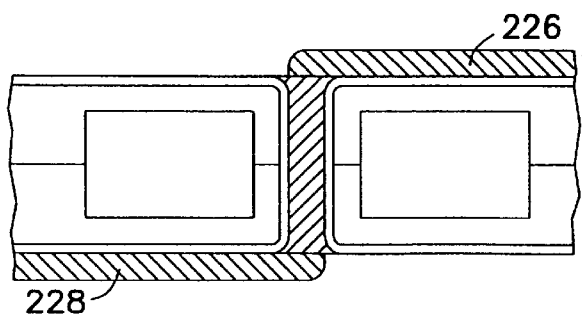

As shown in FIG. 2e, wiring layers 226 and 228 are formed outwardly from surfaces 206 and 212, respectively. These wiring layers are deposited and patterned to enable connections to interconnect 220 and further to integrated circuits as shown in FIG. 1 using techniques such as solder bump bonding and to an integrated circuit package by wire bonds. It is noted that wire layers 226 and 228 are shown as a single level metallization. However, such wiring layers may comprise multiple levels of wiring using, for example, a combination of low resistivity copper and low permitivity polyimide to build high-performance multi level structures. It is also noted that a number of interconnects 220 may be formed through semiconductor wafers 202 and 204 as needed for a particular interconnection of semiconductor integrated circuits that are to be coupled to interposer 200 at surfaces 206 and 212.

Figure 3:
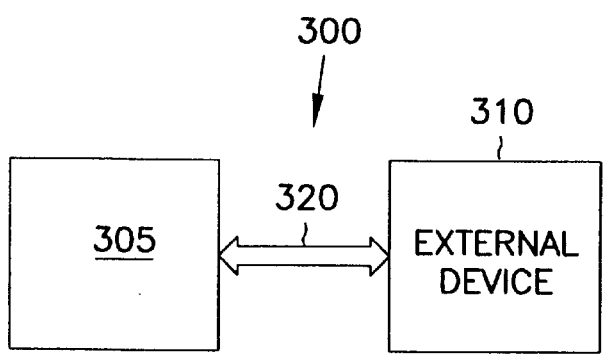
FIG. 3 is a block diagram illustrating a computer system according to an embodiment of the present invention.

FIG. 3 is a block diagram illustrating a computer system 300 according to an embodiment of the present invention. The computer system 300 includes an electronic system 305. The electronic system 305 includes a number of integrated circuits formed on semiconductor wafers that are interconnected through, and disposed on, surfaces of a semiconductor interposer. The semiconductor interposer includes a number of cooling channels such as the electronic system shown and described with respect to FIG. 1. The computer system 300 includes a number of external devices 310. The number of external devices 310 include, for example, hardware interfaces, input/output devices, a display screen and other appropriate components of a computer system. The computer system 300 includes a system bus 320. The system bus 320 couples the number of external devices 310 to the electronic system 305.

Figure 4:
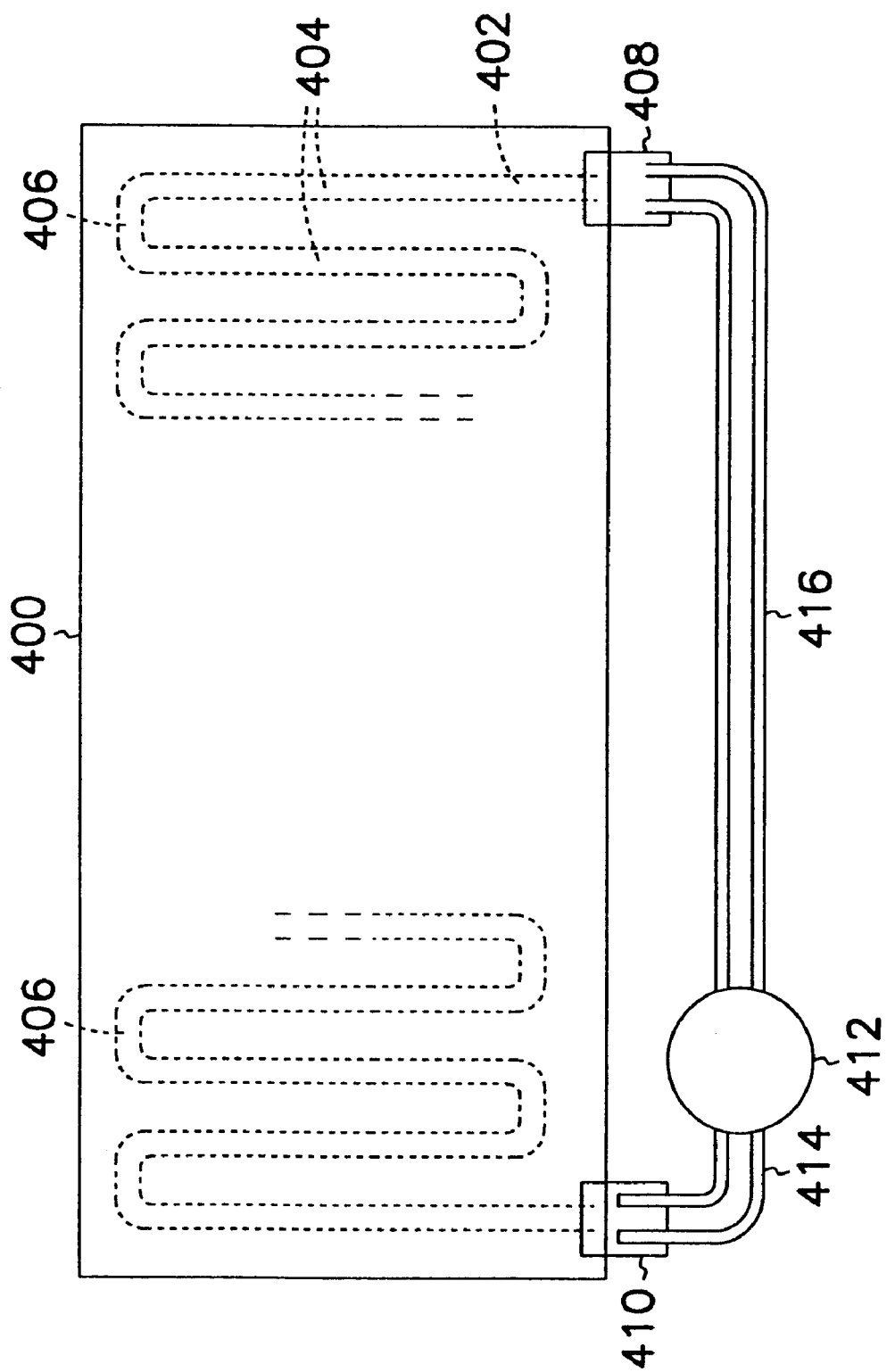
FIG. 4 is a schematic diagram that illustrates an embodiment of a semiconductor interposer with a pump/heat exchanger coupled to cooling channels of the semiconductor interposer.

FIG. 4 is a schematic diagram that illustrates an embodiment of a semiconductor interposer 400. Semiconductor interposer 400 includes cooling channel 402. Cooling channel 402 includes a number of parallel channels 404 that are selectively coupled by end channels 406 to form a continuous channel from inlet 408 to outlet 410. Semiconductor interposer 400 is coupled to heat dissipation device 412 by plastic tubing 414 and 416. Device 412 may comprise, for example, a miniature electro-mechanical pump and heat exchanger for circulating liquids such as water or antifreeze solutions such as ethylene glycol. Alternatively, device 412 may comprise a miniature compressor and heat exchanger for circulating Freon-type refrigerants.

Conclusion

An improved structure and method for interconnecting different integrated circuits formed on separate semiconductor wafers is provided. This improved structure includes a semiconductor interposer having cooling channels formed through a center portion of the interposer. These cooling channels can be filled with a liquid or refrigerant in order to dissipate heat generated by one or more of the integrated circuits.

In particular, an illustrative embodiment of the present invention includes an electronic assembly. The electronic assembly includes a semiconductor interposer having first and second surfaces and having cooling channels passing through the interposer between the first and second surfaces. At least one semiconductor chip is disposed outwardly from the first surface of the semiconductor interposer. At least one semiconductor chip is disposed outwardly from the second surface of the semiconductor interposer. A number of electrical connections are formed through the semiconductor interposer. The number of electrical connections couple the semiconductor chips disposed outwardly from the first and second surfaces of the semiconductor interposer.

In another embodiment, an electronic system module is provided. The electronic system module includes a semiconductor interposer having first and second opposing surfaces and having cooling channels passing through the interposer between the first and second opposing surfaces. A wiring layer is formed on at least one of the opposing surfaces of the semiconductor interposer. A number of semiconductor chips are disposed outwardly from at least one of the surfaces of the semiconductor interposer and interconnected using the wiring layer. Each semiconductor chip has a working surface containing an integrated circuit that is coupled to the wiring layer.

In another embodiment, a computer system is provided. The computer system includes an electronic assembly. The electronic assembly includes a semiconductor interposer having first and second surfaces and having cooling channels passing through the interposer between the first and second surfaces. The electronic assembly further includes a number of semiconductor chips disposed outwardly from at least one of the surfaces of the semiconductor interposer and interconnected with each other. The computer system further includes a number of external devices. A system bus couples the electronic assembly to the number of external devices.

In another embodiment, a method for forming an electronic system is provided. The method includes forming trenches in working surfaces of first and second semiconductor wafers. The method includes bonding the wafers together such that the trenches align to form cooling channels for a semiconductor interposer. The cooling channels are filled with a liquid. A wiring layer is formed on at least one surface of the semiconductor interposer. Integrated circuits from a number of semiconductor wafers are coupled together with the wiring layer.

In another embodiment, an electronic system module is provided. The electronic system module includes a semiconductor interposer having first and second opposing surfaces and having cooling channels passing through the interposer between the first and second opposing surfaces. The cooling channels are filled with a liquid. Portions of a wiring layer are formed on the first and second opposing surfaces of the semiconductor interposer. The wiring layer includes a number of electrical connections extending through the semiconductor interposer. A number of semiconductor chips are disposed outwardly from at least one of the surfaces of the semiconductor interposer and interconnected using the wiring layer. Each semiconductor chip has a working surface containing an integrated circuit that is coupled to the wiring layer.

In another embodiment, a semiconductor interposer is provided. The semiconductor interposer includes a first semiconductor wafer having a working surface. The semiconductor interposer further includes a second semiconductor wafer having a working surface. A number of trenches are formed in at least one of the working surfaces of the first and second semiconductor wafers. The first and second semiconductor wafers are bonded together such that the trenches form cooling channels for the semiconductor interposer.

In another embodiment, a semiconductor interposer is provided. The semiconductor interposer includes a first semiconductor wafer having a working surface and a wiring surface. The semiconductor interposer also includes a second semiconductor wafer with a working surface and a wiring surface. A number of trenches are formed in the working surfaces of the first and second semiconductor wafers. The working surfaces of the first and second semiconductor wafers are bonded together such that the trenches from the first semiconductor wafer align with the trenches of the second semiconductor wafer to form cooling channels for the semiconductor interposer. A wiring layer is formed on the wiring surfaces of the first and second semiconductor wafers.

In another embodiment, a semiconductor interposer is provided. The semiconductor interposer includes a layer of semiconductor material. A number of cooling channels are formed through the layer of semiconductor material. The cooling channels are filled with a liquid.

In another embodiment, an electronic system module is provided. The electronic system module includes a semiconductor interposer having first and second opposing surfaces and having cooling channels passing through the interposer between the first and second opposing surfaces. The semiconductor interposer is formed from first and second wafers of semiconductor material. The cooling channels are filled with a liquid. A wiring layer is also provided that has portions that are formed on the first and second opposing surfaces of the semiconductor interposer. The wiring layer includes a number of electrical connections extending through the semiconductor interposer. A number of semiconductor chips are disposed outwardly from at least one of the surfaces of the semiconductor interposer and interconnected using the wiring layer. Each semiconductor chip has a working surface containing an integrated circuit that is coupled to the wiring layer. The number of semiconductor chips include a microprocessor and a memory device.

In another embodiment, a method for forming a semiconductor interposer is provided. The method includes forming trenches in working surfaces of first and second semiconductor wafers. The method further includes bonding the wafers together such that the trenches align to form cooling channels. A wiring layer is formed on at least one surface of the semiconductor wafers.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the various illustrative embodiments described herein. It is to be understood that the description is intended to be illustrative, and not restrictive. Combinations of the above embodiments, and other embodiments will be apparent to those of skill in the art upon reviewing the description contained herein. The scope of the invention includes any other applications in which the above structures and fabrication methods are used.

For example, FIG. 1 shows just two integrated circuits (semiconductor chips 125 and 130) coupled to interposer 110 in electronic assembly 100. It is understood that the number of integrated circuits and semiconductor chips that are coupled to an interposer can be varied to meet the needs of a specific application. Further, the cooling channels can be formed from trenches in only one of the semiconductor wafers used to create the semiconductor interposer. Alternatively, the semiconductor wafers of the interposer may be formed such that their respective trenches selectively align or do not align with the trenches in the other semiconductor wafer. Semiconductor wafers can also be coupled to a wiring layer on only one side of the semiconductor interposer.

What is claimed is:

1. An electronic assembly, comprising:
   a semiconductor wafer having first and second surfaces and having cooling channels passing through the wafer between the first and second surfaces;
   at least one integrated circuit disposed outwardly from the first surface of the semiconductor wafer;
   at least one integrated circuit disposed outwardly from the second surface of the semiconductor wafer; and
   a number of electrical connections through the semiconductor wafer wherein the number of electrical connections couple the integrated circuits disposed outwardly from the first and second surfaces of the semiconductor wafer.

2. The electronic assembly of claim 1, wherein the at least one integrated circuit disposed outwardly from the first surface of the semiconductor wafer includes a memory integrated circuit.

3. The electronic assembly of claim 2, wherein the memory integrated circuit is a DRAM integrated circuit.

4. The electronic assembly of claim 1, wherein the at least one integrated circuit disposed outwardly from the first surface of the semiconductor wafer includes a microprocessor integrated circuit.

5. The electronic assembly of claim 1, wherein the cooling channels are filled with a liquid.

6. The electronic assembly of claim 1, wherein the cooling channels are filled with a refrigerant.

7. The electronic assembly of claim 1, wherein the semiconductor wafer further comprises first and second semiconductor wafers that are bonded together.

8. The electronic assembly of claim 7, wherein the first and the second semiconductor wafers each include trenches formed in a working surface thereof such that the trenches align to form the cooling channels of the bonded semiconductor wafer.

9. The electronic assembly of claim 1, and further including a heat dissipation device coupled to the cooling channels.

10. The electronic assembly of claim 9, wherein the heat dissipation device comprises a heat exchanger and a pump.

11. The electronic assembly of claim 9, wherein the heat dissipation device comprises a heat exchanger and a compressor.

12. An electronic system module, comprising:
    a semiconductor wafer having first and second opposing surfaces and having cooling channels passing through the wafer between the first and second opposing surfaces;
    a wiring layer formed on at least one of the opposing surfaces of the semiconductor wafer;
    a number of semiconductor chips disposed outwardly from at least one of the opposing surfaces of the semiconductor wafer and interconnected to the at least one of the opposing surfaces using the wiring layer; and
    each semiconductor chip having a working surface containing an integrated circuit that is coupled to the wiring layer.

13. The electronic system module of claim 12, and further comprising a number of semiconductor chips disposed outwardly from both the first and the second opposing surfaces, a number of electrical connections extending through the semiconductor wafer, the number of electrical connections coupling the number of semiconductor chips on each opposing surface of the semiconductor wafer together.

14. The electronic system module of claim 12, wherein the number of semiconductor chips include a microprocessor and a memory device.

15. The electronic system module of claim 12, wherein the cooling channels are filled with a liquid.

16. The electronic system module of claim 12, wherein the cooling channels are filled with a refrigerant.

17. The electronic system module of claim 12, wherein the semiconductor wafer further comprises first and second semiconductor wafers that are bonded together to form an all silicon structure.

18. The electronic system module of claim 17, wherein the first and the second semiconductor wafers each include trenches formed in a working surface thereof such that the trenches align to form the cooling channels of the bonded silicon structure.

19. The electronic system module of claim 12, and further including a heat dissipation device coupled to the cooling channels.

20. The electronic system module of claim 19, wherein the heat dissipation device comprises a heat exchanger and a pump.

21. The electronic system module of claim 19, wherein the heat dissipation device comprises a heat exchanger and a compressor.

22. A computer system, comprising:
   an electronic assembly, the electronic assembly including:
      a semiconductor wafer having first and second surfaces and having cooling channels passing through the wafer between the first and second surfaces, and
      a number of semiconductor chips disposed outwardly from both the first and second surfaces and electrically interconnected through the semiconductor wafer,
   a number of external devices; and
   a system bus, wherein the system bus couples the electronic assembly to the number of external devices.

23. The computer system of claim 22, wherein the number of semiconductor chips includes a memory chip.

24. The computer system of claim 23, wherein the memory chip is a DRAM chip.

25. The computer system of claim 22, wherein the number of semiconductor chips includes a microprocessor chip.

26. The computer system of claim 22, wherein the cooling channels are filled with a liquid.

27. The computer system of claim 22, wherein the cooling channels are filled with a refrigerant.

28. The computer system of claim 22, wherein the semiconductor wafer further comprises first and second semiconductor wafers that are bonded together to form an all silicon structure.

29. The computer system of claim 28, wherein the first and the second semiconductor wafers each include trenches formed in a working surface thereof such that the trenches align to form the cooling channels of the bonded all silicon structure.

30. The computer system of claim 22, and further including a heat dissipation device coupled to the cooling channels.

31. The computer system of claim 30, wherein the heat dissipation device comprises a heat exchanger and a pump.

32. The computer system of claim 30, wherein the heat dissipation device comprises a heat exchanger and a compressor.

33. A method for forming an electronic system, the method comprising:
   forming trenches in working surfaces of first and second semiconductor wafers;
   bonding the wafers together such that the trenches align to form cooling channels for an all silicon structure formed of the first and the second semiconductor wafers;
   filling the cooling channels with a liquid;
   forming a wiring layer on at least one surface of the all silicon structure formed of the first and the second semiconductor wafers; and
   coupling integrated circuits from a number of additional semiconductor wafers, attached to the all silicon structure formed of the first and the second semiconductor wafers, together with the wiring layer.

34. The method of claim 33, and wherein filling the cooling channels with a liquid comprises filling the cooling channels with a refrigerant.

35. The method of claim 33, wherein coupling the integrated circuits from a number of additional semiconductor wafers, attached to the all silicon structure formed of the first and the second semiconductor wafers, together includes coupling a microprocessor chip to the wiring layer.

36. The method of claim 33, wherein coupling the integrated circuits from a number of additional semiconductor wafers, attached to the all silicon structure formed of the first and the second semiconductor wafers, together includes coupling a memory chip to the wiring layer.

37. The method of claim 33, and wherein forming the wiring layer includes:
   forming a first layer on a first surface of the all silicon structure formed of the first and the second semiconductor wafers;
   forming a second layer on a second surface of the all silicon structure formed of the first and the second semiconductor wafers; and
   forming vias through the all silicon structure formed of the first and the second semiconductor wafers in order to selectively connect the first and second layers on opposing sides of the all silicon structure formed of the first and the second semiconductor wafers.

38. The method of claim 33, wherein the channels are filled with liquid after the integrated circuits are coupled to the wiring layer.

39. The method of claim 33, and further comprising coupling a heat exchanger and a compressor to the cooling channels.

40. The method of claim 33, and further comprising coupling a hear exchanger and a pump to the cooling channels.

41. An electronic system module, comprising:
   a semiconductor wafer having first and second opposing surfaces and having cooling channels passing through the wafer between the first and second opposing surfaces;
   wherein the cooling channels are filled with a liquid;
   a wiring layer having portions formed on the first and second opposing surfaces of the semiconductor wafer;
   the wiring layer including a number of electrical connections extending through the semiconductor wafer;
   a number of semiconductor chips disposed outwardly from at least one of the surfaces of the semiconductor wafer and interconnected using the wiring layer; and each semiconductor chip having a working surface containing an integrated circuit that is coupled to the wiring layer.

42. The electronic system module of claim 41, wherein the liquid is a refrigerant.

43. The electronic system module of claim 41, wherein the semiconductor wafer further comprises first and second semiconductor wafers that are bonded together to form an all silicon structure.

44. The electronic system module of claim 41, wherein the first and the second semiconductor wafers each include trenches formed in a working surface thereof such that the trenches align to form the cooling channels of the bonded semiconductor wafer.

45. The electronic system module of claim 41, wherein the number of semiconductor chips include a microprocessor and a memory device.

46. The electronic system module of claim 41, and further including a heat dissipation device coupled to the cooling channels.

47. The electronic system module of claim 46, wherein the heat dissipation device comprises a heat exchanger and a pump.

48. The electronic system module of claim 46, wherein the heat dissipation device comprises a heat exchanger and a compressor.

49. A bounded silicon structure, comprising:

a first semiconductor wafer having a working surface;

a second semiconductor wafer having a working surface;

a number of trenches formed on opposite sides of the working surfaces of the first and second semiconductor wafers; and wherein the first and second semiconductor wafers are bonded together to form the bounded silicon structure and such that the trenches are aligned to form cooling channels through the bounded silicon structure.

50. A bounded silicon structure, comprising:

a first semiconductor wafer having a working surface and a wiring surface;

a second semiconductor wafer having a working surface and a wiring surface;

a number of trenches formed in the working surfaces of the first and second semiconductor wafers;

wherein the working surfaces of the first and second semiconductor wafers are bonded together to form the bounded silicon structure such that the trenches from the first semiconductor wafer align with the trenches of the second semiconductor wafer to form cooling channels through the bounded silicon structure; and a wiring layer formed on the wiring surfaces of the first and second semiconductor wafers.

51. An electronic system module, comprising:

a semiconductor wafer having first and second opposing surfaces and having cooling channels passing through the interposer between the first and second opposing surfaces;

wherein the semiconductor wafer is formed from first and second wafers of semiconductor material bonded together;

wherein the cooling channels are filled with a liquid;

a wiring layer having portions formed on the first and second opposing surfaces of the semiconductor wafer;

the wiring layer including a number of electrical connections extending through the semiconductor wafer;

a number of semiconductor chips disposed outwardly from at least one of the surfaces of the semiconductor wafer and interconnected using the wiring layer;

each semiconductor chip having a working surface containing an integrated circuit that is coupled to the wiring layer; and wherein the number of semiconductor chips include a microprocessor and a memory device.

52. A method for forming a bounded silicon structure, the method comprising:

forming trenches in working surfaces of first and second semiconductor wafers;

bonding the wafers together to form the bounded silicon structure such that the trenches align to form cooling channels in the bounded silicon structure; and forming a wiring layer on at least one surface of the semiconductor wafers which is on an opposing side from the working surfaces.

53. The method of claim 52, wherein forming trenches comprises forming trenches using an anodic etching process.

54. The method of claim 52, wherein bonding the wafers comprises using a vacuum bonding process.

55. The method of claim 52, wherein forming the wiring layer comprises:

forming a first layer on a surface opposing the working surface of the first semiconductor wafer;

forming a second layer on a surface opposing the working surface of the second semiconductor wafer; and forming vias through the bounded silicon structure in order to selectively connect the first and second layers.

* * * * *